United States Patent [19]

Skrobko

[11] Patent Number: 5,347,389
[45] Date of Patent: Sep. 13, 1994

[54] PUSH-PULL OPTICAL RECEIVER WITH CASCODE AMPLIFIERS

[75] Inventor: John Skrobko, Berkeley Lake, Ga.

[73] Assignee: Scientific-Atlanta, Inc., Norcross, Ga.

[21] Appl. No.: 68,371

[22] Filed: May 27, 1993

[51] Int. Cl.$^5$ .............................................. H04B 10/06
[52] U.S. Cl. ................................ 359/189; 250/214 A; 330/59; 330/308
[58] Field of Search ............... 359/188, 189, 190, 194, 359/161, 195; 250/214 A; 330/59, 308

[56] References Cited

U.S. PATENT DOCUMENTS

| | | | |
|---|---|---|---|
| 3,210,681 | 10/1965 | Rhodes | 330/308 |
| 3,296,463 | 1/1967 | Brault | 330/305 |
| 3,327,238 | 6/1967 | Harwood | 330/31 |
| 3,329,904 | 7/1967 | Horowitz | 330/308 |
| 4,092,610 | 5/1978 | White et al. | 330/207 A |
| 4,301,543 | 11/1981 | Palmer | 455/612 |
| 4,415,803 | 11/1983 | Muoi | 250/214 A |
| 4,535,233 | 8/1985 | Abraham | 250/214 A |
| 4,563,656 | 1/1986 | Baum | 330/308 |
| 4,564,818 | 1/1986 | Jones | 330/311 |
| 4,609,880 | 9/1986 | Dermitzakis et al. | 330/308 |
| 4,620,321 | 10/1986 | Chown | 250/214 A |
| 4,641,378 | 2/1987 | McConnell et al. | 330/59 |
| 4,647,762 | 3/1987 | Chown | 250/214 A |
| 4,750,216 | 6/1988 | Boyce | 250/551 |
| 4,750,217 | 6/1988 | Smith et al. | 485/619 |
| 4,752,745 | 6/1988 | Pass | 330/265 |
| 4,761,549 | 8/1988 | Mealer, III et al. | 250/214 A |
| 4,882,482 | 11/1989 | Smith et al. | 250/214 A |
| 4,897,615 | 1/1990 | Chen et al. | 330/263 |
| 4,968,948 | 11/1990 | Tokumo et al. | 330/10 |
| 4,998,012 | 3/1991 | Kruse | 359/195 |
| 5,013,903 | 5/1991 | Kasper | 250/214 A |
| 5,095,286 | 3/1992 | Cole et al. | 330/308 |
| 5,239,402 | 8/1993 | Little, Jr. et al. | 359/189 |

FOREIGN PATENT DOCUMENTS

| | | |
|---|---|---|
| 85114446.9 | 6/1986 | European Pat. Off. . |
| 0384205 | 2/1990 | European Pat. Off. . |
| 2929083 | 12/1980 | Fed. Rep. of Germany . |
| 3217309 | 11/1983 | Fed. Rep. of Germany . |
| 253333A1 | 1/1988 | Fed. Rep. of Germany . |
| 53-142154 | 11/1978 | Japan . |
| 0085944 | 7/1981 | Japan .......... 359/189 |
| 59-50632 | 3/1984 | Japan . |
| 0250928 | 10/1988 | Japan .......... 359/189 |

Primary Examiner—Richard E. Chilcot, Jr.
Assistant Examiner—Kinfe-Michael Negash
Attorney, Agent, or Firm—Jones & Askew

[57] ABSTRACT

An improved optical receiver for an optical signal amplitude modulated with broadband RF signals is described. The optical receiver includes an optical detector which receives the optical signal and generates a radio frequency electrical signal which varies with the intensity level of the incoming optical signal. The electrical signal is applied antiphased from the optical detector to a pair of cascode transimpedance amplifiers which are coupled in a push-pull relationship. The coupling from the optical detector is matched to each of the inputs of the cascode amplifiers. Bias networks are used for each amplifier to maintain the gain stability of the receiver and to provide better output impedance matching to a coaxial cable for CATV distribution. The optical receiver can provide greater output power for the same input power because of the shared bias currents of the cascode stages in each amplifier.

14 Claims, 2 Drawing Sheets

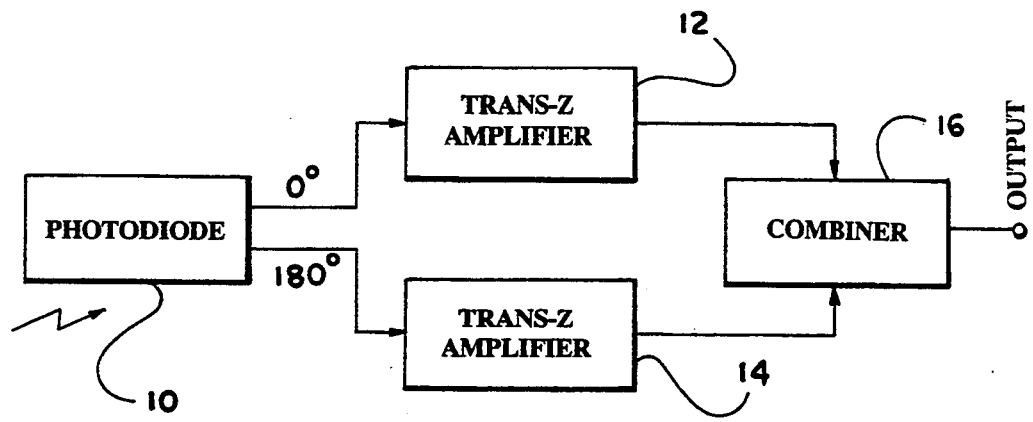
Fig_1 PRIOR ART
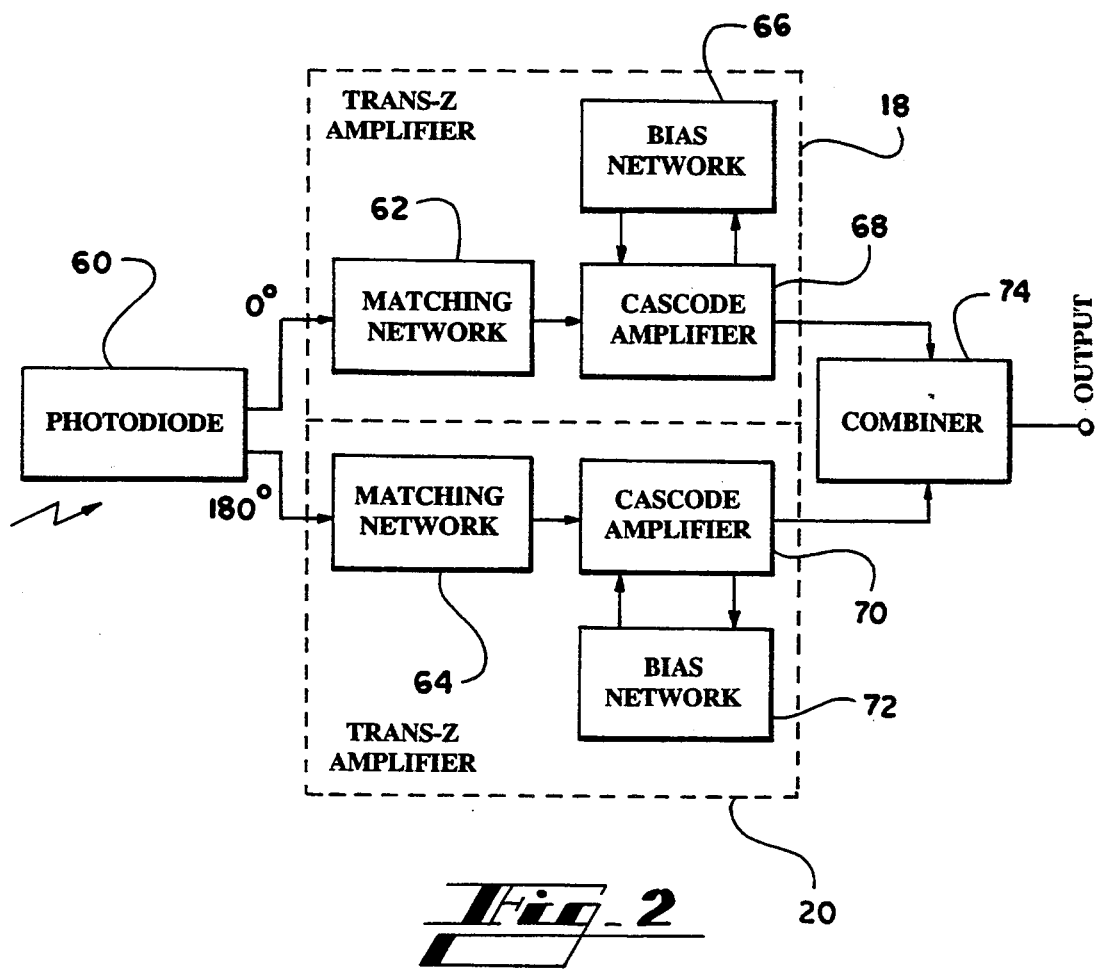
Fig_2

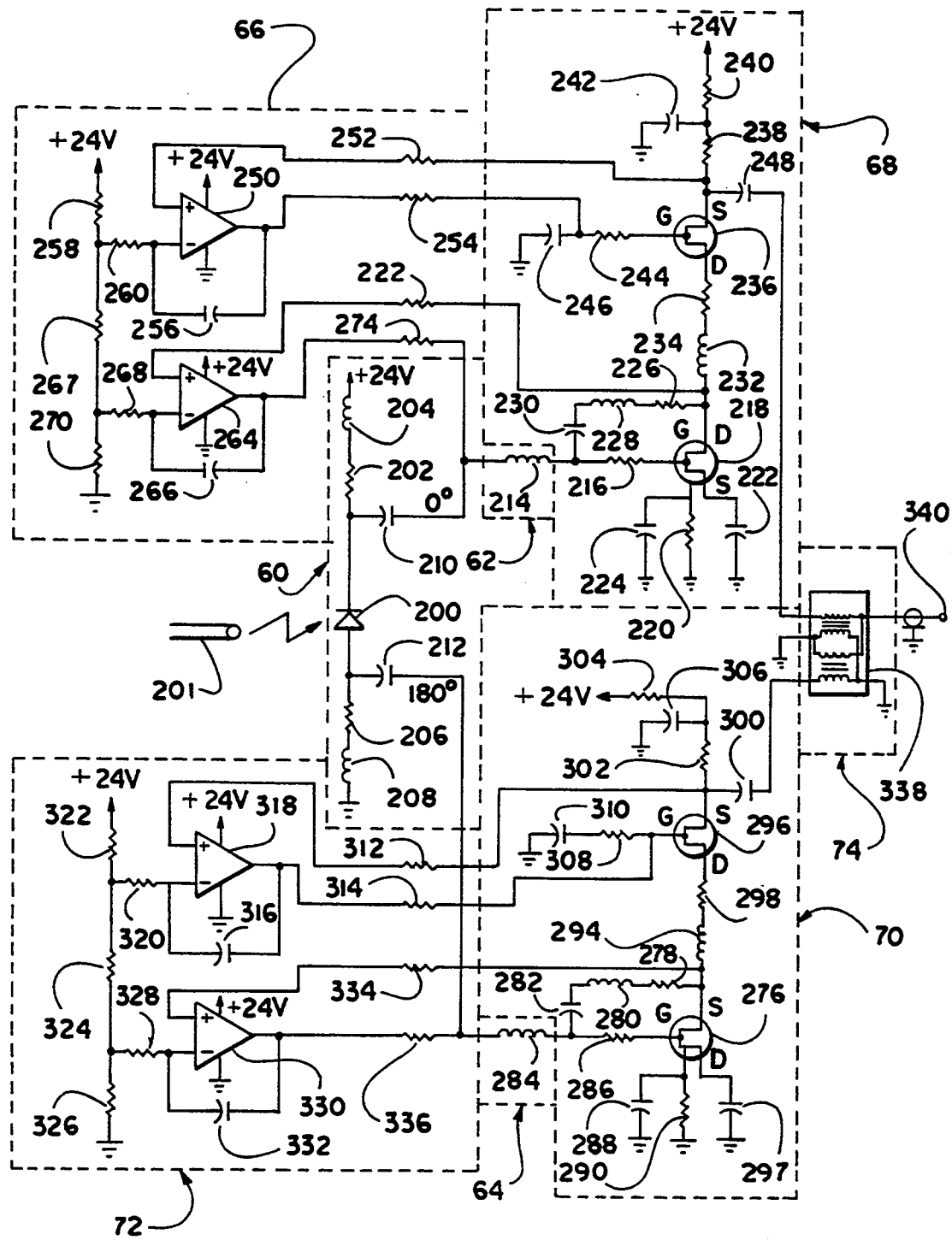
Fig_3

PUSH-PULL OPTICAL RECEIVER WITH CASCODE AMPLIFIERS

FIELD OF THE INVENTION

The present invention pertains generally to optical communications systems and is more particularly directed to an improved push-pull optical receiver including cascode amplifiers adapted to receive optical signals which are intensity modulated with broadband video signals.

BACKGROUND OF THE INVENTION

In recent years, there has been a great deal of interest in the transmission of video signals via optical fibers. This mode of signal transmission offers a number of advantages over transmitting signals by conventional coaxial cable, the manner in which video signal distribution is now commonly accomplished in CATV systems. Optical fibers intrinsically have more information-carrying capacity than do coaxial cables. In addition, there is less signal attenuation in optical fibers than in coaxial cables adapted to carry radio frequency (RF) signals. Consequently, optical fibers can span longer distances between signal regenerators than is possible with coaxial cable. The dielectric nature of optical fibers eliminates any problems with electrical shorting and they are immune to ambient electromagnetic interference (EMI) and generate no EMI of their own.

The amplitude (intensity) modulation of an optical signal with a broadband RF signal requires a light modulating device, such as a laser, which has linear characteristics over a wide dynamic range of operation. Until recently it has been difficult to fabricate lasers in which the relationship between the input current and the optical output was linear over more than an extremely limited range. Because of this difficulty in obtaining lasers which were sufficiently linear to support analog amplitude modulation, digital modulation was, until recently, the primary means for transmitting information by optical signals. Digital modulation does not require a laser with a large dynamic range as do analog means for transmitting information, e.g., amplitude modulation or frequency modulation of a carrier frequency modulating the laser output.

However, because of the broadband nature of video signals, digitization of these signals consumes extremely large amounts of channel capacity. A typical analog video signal occupies 6 MHz of bandwidth. Transmission of this information digitally requires a digital data transmission rate of approximately 45 Mb/sec. High definition video (HDTV) may require a digital data transmission rate of up to 145 Mb/sec. Moreover, encoders and decoders for converting analog video signals to a digital form and for reconverting these digital signals to an analog form for viewing on a conventional television set are quite expensive. Consequently, the analog transmission of video signals is potentially much more economical than digital transmission of such signals.

Recent advances in laser technology have made the analog modulation of optical signals more feasible. Currently available Fabry-Perot (FP) and Distributed Feedback (DFB) lasers have sufficiently linear characteristics to allow them to be used as analog modulators of optical signals.

One such means of analog transmission is to use a baseband television signal to frequency modulate a radio frequency carrier. This modulated radio frequency carrier is, in turn, used to modulate an optical signal. Such frequency modulation is less susceptible to noise than is amplitude modulation, but it requires more bandwidth for each television channel transmitted than is required by amplitude modulation methods. Thus, the number of television channels which can be carried by each optical transmission on separate optical fibers in an FM-based system is somewhat limited. Moreover, since the standard NTSC format for video calls for amplitude modulation of the video carrier, means for converting FM signals to an NTSC amplitude modulated format are required either at the television receiver or at the point at which the fiber transmission trunk is connected to a coaxial cable distribution network. The need for such FM to AM conversion increases the cost of the system.

In view of the above, a system in which a video baseband signal amplitude modulates a radio frequency carrier signal, which in turn intensity modulates an optical signal, is preferable to other systems from the standpoint of cost and simplicity. However, several phenomena limit the number of radio frequency channels which can be carried by present day optical links where the intensity of the optical signals is amplitude modulated. The first of these phenomena is a limitation of the amount of radio frequency energy which may be supplied as a modulating signal to a laser or other light generating device before various types of distortions are generated by the light generating device.

This power limitation relates to the sum of the radio frequency power contributions of each radio frequency channel. Thus, if it is desired to transmit 80 radio frequency channels over a single optical link, the power available for each channel is only half of the power which would be available if only 40 channels were transmitted by the optical link. Such a limitation on the power of each radio frequency carrier brings each of these carriers closer to the "white noise" level of the system, thus, adversely affects the signal to noise ratio of the system. Decreasing the number of channels carried by each optical link in order to improve the signal to noise ratio increases the number of lasers which must be used and the overall complexity and cost of the system.

In addition, increasing the amount of radio frequency power supplied to the laser beyond certain limits may cause the laser to produce several types of distortion. When the modulating signal supplied to a laser causes the laser to be driven into a nonlinear portion of its input-signal-to-light-output characteristic, harmonic distortion may be produced. The products of this type of distortion are signals which are integer multiples of the "primary" frequency or carrier frequencies of the video signals. The second harmonic of 54 MHz is, for example, 108 MHz. Thus, if the bandwidth accommodated by a system is such that there are channels at both 54 MHz and 108 MHz, second harmonics of the 54 MHz channel will interfere with the signals on the 108 MHz channel.

Intermodulation distortion is also of particular concern in amplitude modulated systems. Such distortion results in distortion products at frequencies which are the sum or difference of two other frequencies. The distortion products which are the sum or difference of two primary frequencies are termed second order distortion products and are particularly troublesome. For example, a video channel at 150 MHz and another video channel at 204 MHz may produce a second order distortion product at 54 MHz (the difference frequency) and at 354 MHz (the sum frequency). Significant third order distortion products may be generated by mixing signals at three frequencies or by third harmonic generation. Lesser, third order distortion products are produced by the mixing of a primary frequency with a second order distortion product. This produces third order distortion products at the sum and difference between the primary frequency and the frequency of the second order distortion product.

Clearly, one method of dealing with the above problems is to utilize detectors and optical receivers which are highly linear and which are relatively insusceptible to harmonic and intermodulation distortion. It is especially important that the production of second order distortion products be minimized. Optical receivers are combinations of optical detectors and specialized receiver amplifiers which serve to convert the amplitude modulated light to conventional broadband RF output signals comprising multi-channel video and/or data signals. Such optical receivers should be effective over a bandwidth of approximately 50 MHz to 550 MHz, or higher, so as to be compatible with current coaxial cable transmission technology. It is presently desirable that an optical receiver be effective at frequencies greater than 550 MHz in order to accommodate additional bandwidth which may be required in future CATV systems.

Optical detectors for converting the amplitude modulation of an optical signal to a radio frequency electrical signal corresponding to the modulation may comprise, for example, photodiodes. This type of device produces an output current corresponding to the amplitude or intensity of light applied to it. One advantageous type of receiver amplifier which has been used for converting the output current signal from such a photodiode to an RF voltage signal suitable for transmission on a conventional coaxial cable for broadband signals is known as a transimpedance amplifier.

The transimpedance amplifier tends to avoid the high frequency roll-off problem associated with other high impedance amplifiers. The transimpedance amplifier is similar to other high impedance amplifiers except for the addition of a feedback path, for example, between the drain and gate of a field effect transistor in a common drain configuration. A characteristic of this circuit is that its input impedance is approximately equal to the feedback impedance $R_f$ divided by 1 plus the transconductance $G_m$ of the circuit or $(R_f/1+G_m)$. Thus, depending on the selection of an appropriate value for $R_f$, the input impedance of a transimpedance amplifier can be lower than that of a similar high frequency amplifier. This relatively lower input impedance minimizes the problem of high frequency roll-off in the 50 to 550 MHz frequency band.

Transimpedance and other high frequency amplifiers are both susceptible to second order and other even and odd order distortion problems when they are used for the amplification of broadband signals which include a high number of video carrier frequencies. In high impedance amplifiers, these distortion products tend to be more severe at the low end of the frequency band. In transimpedance amplifiers, the problem of second order distortion products is essentially the same throughout the band of operation.

The troublesome second order distortion problems can be alleviated in transimpedance amplifiers by using a dual matched amplifier configuration coupled in a push-pull relationship. Since the nonlinearities of each of the amplifiers can be made to be relatively similar, the balanced configuration of a push-pull coupling tends to cancel out these nonlinearities and thus alleviate the problem of second order intermodulation products of the input frequencies being produced. An advantageous push-pull transimpedance amplifier for an optical receiver is disclosed in a U.S. patent application Ser. No. 481,436 now U.S. Pat. No. 5,239,402 entitled "Push-Pull (optical receiver)" filed on Feb. 16, 1990 in the name of Little, et al.

Optical receivers have previously used transimpedance amplifiers which have two stages. In general, such amplifiers include a transimpedance stage comprising a field effect transistor or other amplification device in a common source (emitter) configuration. The output of the transimpedance stage is then buffered by a second stage used for impedance matching and power transfer to a output power combiner.

While extremely advantageous for linearizing and converting broadband optical signals into RF signals, this configuration does present some problems. An initial problem is inherent in the common drain (emitter) configuration and is termed the "Miller effect" where the amplifier stage amplifies the feedback capacitance of the device by its voltage gain and thereby reduces the high frequency response of the amplifier. Because most devices configured for voltage gains produce such effects, it is difficult to increase the bandwidth of the amplifier.

In high sensitivity systems, such as broadband optical receivers, noise performance is critical. Unfortunately, there is always some noise associated with the amplifier itself and, in the present configuration, some noise can also be attributed to the buffer stage. The choice of the configuration for the output impedance matching stage to minimize this additional noise is important.

Another inherent difficulty with this configuration is, because there are two cascade stages, there are two bias currents even when the optical receiver is in a quiescent state. This limits the efficiency of the conversion process where output power is limited to some percentage of input power. Moreover, when there are two bias circuits in each amplifier, the exact matching of both amplifiers for distortion cancellation in a push-pull arrangement becomes more difficult.

SUMMARY OF THE INVENTION

The present invention provides an improved optical receiver which is considerably more linear and of higher output power than previous receivers for the conversion of optical signals into broadband amplitude modulated RF signals. This linearity substantially alleviates harmonic and intermodulation distortion problems experienced by previous optical receivers. The present invention provides for increased RF output power from the optical receiver without increasing the nonlinearities.

In accordance with the present invention, the nonlinearity of the amplifier circuitry of the receiver is effectively canceled out by using a pair of matched cascode transimpedance amplifiers coupled in a push-pull configuration. Since the nonlinearities of each of these amplifiers are relatively similar, the balanced configuration of the push-pull amplifiers tend to cancel out these nonlinearities and thus alleviate the problem of second order intermodulation products of the input frequencies being produced.

In a presently preferred embodiment of the invention, the signals produced at the output of a photodiode are fed antiphased to the inputs of a pair of transimpedance cascode amplifiers. The cascode amplifiers are connected in a balanced push-pull configuration and coupled to the inputs of an output power combiner. The output power combiner in the illustrated embodiment comprises a matching transformer which combines the output power from each amplifier in the correct phase to provide for the cancellation of the distortion products and to assist in matching the output power to conventional coaxial cable equipment.

The cascode amplifiers are coupled through respective matching networks to the photodiode. Each of the matching networks serves to provide a more efficient power transfer from the essentially high impedance photodiode to the relatively lower input impedance amplifiers over a broad range of frequencies.

Each cascode amplifier includes a transimpedance stage having a first field effect transistor in a common source configuration and a transimpedance feedback circuit and an impedance matching stage having a second field effect transistor in a common gate configuration as the gain control element of the first field effect transistor.

The cascode amplifiers in a push-pull relationship solve many of the difficulties found in previous optical receivers. Initially, the shared bias currents in this configuration allow for higher output power for the same input power as compared to previous optical receivers. The responses of the separate amplifiers of the push-pull configuration are easier to match with the shared bias currents.

Because the input impedance of the second stage common gate configuration is low, the "Miller effect" on the first stage common source configuration is minimized. This multiplication of drain to gate capacitance typically reduces a common source configuration frequency response. The combination of common source with common gate stages, termed the cascode topology, is an optimized configuration for maximizing bandwidth. Further, it has been found that less amplifier noise is produced with this dual stage configuration than with the cascade dual stage configuration.

Additionally, this dual stage topology provides a bias network connected to the output node of the amplifier which allows control of the amplifier output impedance. This output impedance control capability, along with the impedance matching of the power combiner, provides excellent power transfer effeciency to a standard coaxial cable load.

Therefore, it is an object of the present invention to provide an improved broadband optical receiver having a high power output which is relatively insusceptible to harmonic and intermodulation distortion.

It is yet another object of the invention to improve noise performance for the improved broadband optical receiver.

It is a further object of the present invention that the improved broadband optical receiver have a relatively flat frequency response over a broad range of radio frequency modulation of the optical input signal.

It is a further object of the present invention that the improved optical receiver has a significant output impedance match to the typical CATV system working impedance of 75 ohms.

BRIEF DESCRIPTION OF THE DRAWINGS

These and other objects, features and aspects of the invention will be more clearly understood and better described if the following detailed description of the preferred embodiment is read in conjunction with the appended drawings wherein:

FIG. 1 is a block diagram of a broadband optical receiver including a push-pull transimpedance amplifier configuration of the prior art;

FIG. 2 is a block diagram of a broadband optical receiver including a push-pull transimpedance amplifier using cascode amplifiers constructed in accordance with the present invention; and FIG. 3 is a detailed electrical schematic of the broadband optical receiver illustrated in FIG. 2.

DETAILED DESCRIPTION OF THE PREFERRED EMBODIMENT

In the high impedance and transimpedance amplifiers discussed above, the distortion components which present the most serious problems are second order intermodulation products. Such second order products are formed when any two frequencies are applied at the input of the amplifier. The output signal of the amplifier will include not only the primary input frequencies but also frequency components equal to the sum and to the difference of these two input frequencies. In a broadband amplifier, these sum and/or difference frequencies may be within the frequency band of interest and thus interfere with another primary input signal.

In an ideal amplifier, in which there is a linear relationship between input signal and output signal, second order distortion products are not produced. However, a more realistic relationship between input voltage to output voltage in a broadband amplifier is where there is a relatively linear range between two points of the response curve. Input signals ranging below or above these linear operating points result in severely distorted output signals. Some distortion will result from operation in the linear region. It has been found that by utilizing two amplifiers in a push-pull relationship, the nonlinearities in the input/output characteristics of the two amplifiers can be made to compensate for one another, thus, diminishing distortion due to the sum and difference frequencies being produced. This arrangement has been found especially helpful for reducing second order intermodulation distortion.

In FIG. 1 there is shown a block diagram of the push-pull transimpedance amplifier and optical receiver more fully described in the referenced application by Little, et al. The optical receiver includes a photodetector, particularly a photodiode 10, which has two antiphased RF current connections, one at 0° and one at 180°. The antiphased currents are coupled to the inputs of two matched transimpedance amplifiers 12 and 14. The RF broadband current signals from the photodiode 10 are converted to amplified RF voltage signals in the amplifiers 12 and 14 before being coupled to an output power combiner 16. The combiner 16 couples the amplifiers in a push-pull configuration to reduce the nonlinearities and distortion caused by the amplification and to additively combine the output power of each amplifier into a single signal.

FIG. 2 illustrates a block diagram of a broadband optical receiver constructed in accordance with the present invention. An optical fiber, or other optical source, carries a broadband amplitude modulated optical signal to a photodetector 60. This photodetector may, for example, be a photodiode which is appropriately biased by a bias voltage applied through an appropriate biasing network. This bias produces a DC current in the photodetector when the photodetector is excited by the optical input signal. The current of the photodiode includes an AC component which corresponds to the RF broadband signal modulating the optical signal. It is typical that this component will range between 50 MHz and 550 MHz, or higher. The RF component is separated from the DC current signal and amplified by cascode amplifiers 68 and 70. The outputs of the amplifiers 68 and 70 are coupled to the input terminals of a power combiner 74 which may be a ferrite core impedance transformer of the type adapted for use in broadband RF applications.

Preferably, as set forth below in the description of one preferred embodiment of the invention, the amplifiers 68 and 70 are of the transimpedance type having a cascode configuration. Each cascode amplifier, for example 68, has a matching network 62 connected between the photodiode output and the input to the amplifier and a bias network 66 coupled to the amplifier. The matching network 62 is to more efficiently transfer power from the essentially high impedance photodiode 60 to the lower impedance amplifier 68 over the broad range of frequencies of the signal. The bias network 66 maintains gain control stability of the amplifier 68 and produces a better output impedance match for the power combiner 74. In a similar manner, the matching network 64 and bias network 72 perform the same functions for the amplifier stage 70.

The amplifier 68 with the bias network 66 and matching network 62 form an improved transimpedance amplifier 18. Similar, an improved transimpedance amplifier 20 comprises the matching network 64, the amplifier 70 and the bias network 72.

While the invention is discussed in terms of a push-pull arrangement of transimpedance amplifiers for optical receivers, it should not be limited to such. The arrangement may find advantageous use for the amplification of antiphased RF signals from a number of sources and the improved transimpedance amplifier may be used in various applications and which demand low noise, widebandwidth, and substantial power amplification.

FIG. 3 is a detailed electrical schematic diagram of the a preferred implementation of the optical receiver illustrated in FIG. 2. A photodetector 200, which is preferably a photodiode, receives an optical input signal transmitted to it by an optical fiber 201. The anode terminal of the photodiode 200 is connected through a resistor 206 and inductor 208 to ground. The cathode terminal of the photodiode 200 is connected through a resistor 202 and inductor 204 to a supply voltage, which in the illustrated implementation is +24 V to reverse bias the diode. The photodiode 200 feeds the first amplifier 68 with an in phase signal (0°) through a RF coupling capacitor 210 and the second amplifier 70 with an antiphase signal (180°) through a RF coupling capacitor 212. The inductors 204 and 208 are used to block RF signal current from the power supply and ground while presenting a low impedance to a DC bias current. The DC bias current can then be determined by the serial combination of resistors 202 and 206 without affecting the RF signal component to a great degree.

This bias configuration provides an effective method for generating an in phase and antiphase RF signal which is necessary for the push-pull configuration to produce distortion cancellation. This allows the amplifiers 68 and 70 to be perfectly matched in configuration where both are either inverting or noninverting. There are a number of alternatives where the inversion of one signal may take place in one of the amplifiers 68, 70 or in the power combiner 74, but they generally are not as advantageous as this configuration. In the alternative configurations, only one signal feed would be necessary from the diode 200 which would then be supplied equally to the amplifiers 68 and 70.

Both of the amplifiers 68 and 70 are configured identically, and the following description of the connections and operation of the amplifier 68 may be understood to apply to the amplifier 70. Each amplifier is the combination of a transimpedance stage and a gain control and impedance matching stage. The transimpedance stage is essentially a current amplifier having a common source (collector) configuration and the second stage is a voltage amplifier having a common gate (base) configuration. The common source and common gate configuration will apply if the stage has an FET device and the common collector and common base configuration will apply if the stage has a bipolar device. The power output from the amplifier is the product of these current and voltage gains.

Because in the present implementation the common gate stage follows the transimpedance stage, the "Miller effect" is minimized and not a consideration in the bandwidth of the output. Moreover, the common source configuration in combination with the common gate configurations allow a single bias current to be used through both amplification paths of the amplifier. This allows a more efficient use of the input power.

The amplifier 68 is configured around a transimpedance stage including a gallium arsenide field effect transistor (GaAsFET) 218, the source terminals (S) of which are RF coupled to ground through capacitors 222 and 224. A feedback path is provided between the drain terminal (D) of the GaAsFET 218 and the gate terminal (G) by a feedback impedance network including a resistor 226, an inductor 228 and a capacitor 230. The impedance value of the feedback resistor 226 is selected in accordance with the application into which the amplifier is to be placed.

For example, if the optical fiber 201 feeding the photodiode 200 is relatively long, the intensity of the light fed to the photodiode 200 will be relatively low and correspondingly small RF currents will be produced by the photodiode. It is desirable that the output voltage of the optical receiver be independent of the intensity of the light fed to the photodetector 200. Since a small current flowing through a large impedance will produce the same voltage as a large current flowing through a small impedance, it is desirable for the input transimpedance of the amplifier 68 to be relatively high when this amplifier is used to amplify light signals producing relatively small input currents. Conversely, a receiver which will be driven by relatively high input currents should incorporate an amplifier with a correspondingly lower input transimpedance.

The conversion of signal input current to overall output voltage is referred to as the effective transimpedance of the amplifier. Matched changes to feedback resistors 226 and 278 along with resistors 234 and 298 permit overall effective transimpedances from 300 to 1200 ohms. The inductor 228 is used to tailor the frequency response of the feedback impedance over the bandwidth of interest.

A DC bias voltage which is applied to the gate of the GaAsFET 218 is effectively controlled by a bias regulating network 66 built around operational amplifier 264. The operational amplifier 264 provides a DC bias voltage, which is RF isolated by resistor 274, to the gate terminal of the GaAsFET 218. The operational amplifier 264 is configured to maintain a constant voltage at the drain of GaAsFET 218 through RF isolation resistor 272 equal to the voltage set by a resistive divider comprising resistors 258, 267, and 270. The voltage supplied by the output of operational amplifier 264 through RF isolation resistor 274 to the gate of GaAsFET 218 varies to maintain the drain voltage constant. A capacitor 266 is used to reduce the gain of operational amplifier 264 for high (RF signal) frequencies.

The drain load of the GaAsFET 218 includes a common gate connected amplifier stage including a GaAsFET 236 which produces gain stability and impedance matching for the cascode amplifier. The GaAsFET 236 is connected in a common gate configuration having its gate connected to ground through resistor 244 and RF bypass capacitor 246. The drain terminal of GaAsFET 236 is connected to the drain terminal of the GaAsFET 218 through resistor 234 and inductor 232. The source terminal of the GaAsFET 236 is connected to the power supply +24 V through resistors 238 and 240.

The signal impedance of the drain circuit for GaAsFET 218 is the impedance of resistors 234, 238, and the inductor 232, in addition to the controllable drain to source impedance of the GaAsFET 236. This produces an effective output impedance which is substantially equal to the parallel combination of resistor 238 and the controllable impedance of the GaAsFET 218. This impedance is controlled by setting this bias of this stage so that it will be approximately 150 ohms and so match to the standard 75 ohms of the coaxial cable 340 after the impedance transformation of the power combiner 74.

The operating point of the common gate configuration of the GaAsFET 236 is established by a bias circuit configured around operational amplifier 250. The operational amplifier 250 maintains a constant voltage at the drain of GaAsFET 236 equal to the voltage set by the resistive divider 258, 267, and 270 through RF isolation resistor 252. A DC bias current is established through the cascode stages by impressing a voltage across resistors 238 and 240. The gate voltage of the GaAsFET 236 is varied to maintain this operating point constant. The capacitor 256 reduces the gain of the operational amplifier 250 at high (RF signal) frequencies.

A matching circuit 62 comprising an inductive reactance 214 couples the gate terminal of GaAsFET 218 to the coupling capacitor 210 of the photodiode 200. This inductance is to counteract the frequency effects of the capacitance of the photodiode 200 and the common source input capacitance.

This dual stage configuration produces a substantial increase in bandwidth for the amplifier 68. Due to the broadband requirement of optical receivers, circuit topologies which reduce high frequency rolloff are valuable. One limiting factor is amplifier input capacitance, which, when combined with the source impedance acts as a low pass filter. Common source configurations for amplifiers present significant input capacitance. Additionally, the drain to gate (feedback) capacitance is multiplied by the Miller effect and appears in parallel with the input capacitance. Because the Miller effect is a function of the voltage gain of the amplifier, the effective capacitances can be minimized by reducing the output load on the amplifier, which reduces the voltage gain. The invention achieves this by following a common source amplifier stage with a low input impedance stage, such as the common gate configuration, to produce the cascode topology. In such instance the net effect is that the common gate stage and common source stage will not be subject to the Miller effect and therefore high frequency response will be less limited.

The second amplifier stage 70 is similarly connected with a transimpedance stage comprising the common source GaAsFET 276 and completing the cascode amplifier by a second stage with a common gate configured GaAsFET 296 connected in its drain circuit. The operational amplifiers 318 and 330 respectively provide bias for the GaAsFETs 296 and 276. A matching circuit 64 comprising an inductive reactance 284 couples the gate terminal of the GaAsFET 276 to the coupling capacitor 212 of the photodiode 200.

The drain terminal of the GaAsFET 236 is coupled through a coupling capacitor 248 to an input winding of the transformer 74 while the drain terminal of the GaAsFET 296 is coupled through a coupling capacitor 300 to another input winding of the transformer 74. The transformer 74 is a 4:1 impedance matching transformer which is operable in the 40 MHz to 1 GHz range. The transformer 74 acts to transform the unbalanced load impedance at its output (coaxial cable 340) to the two unbalanced, but 180° oppositely phased, loads from the drains of the GaAsFETS 236, 296. The center tap of the input windings of the transformer 74 provides an RF short to ground to balance the input of the transformer.

The circuit illustrated in FIG. 3 operates in the following manner. Optical energy is transmitted to the photodetector 200 via the optical fiber 201. The photodiode 200 is reverse biased by the biasing network to ensure that the photodiode 200 operates in its most linear region. In the presence of light from the optical fiber 201, the current flowing through the photodiode 200 is determined by the response of the photodiode and the incident optical power applied. When there is RF modulation of the amplitude of the light carried by optical fiber 201, the current through the photodiode will also have an RF amplitude component corresponding to the degree of amplitude modulation of the light. This RF component, which comprises the carrier frequencies of the video signals transmitted over the optical fiber 201, flows through the low RF impedance path provided by coupling capacitors 210 and 212 and thereby to the gates of GaAsFETs 218, 276 of the respective amplifiers 68 and 70.

The magnitudes of the respective output signals of GaAsFETs 218, 276 are determined by the input currents applied to these circuits multiplied by the circuit effective transimpedance. The RF voltage signals at the drains of GaAsFETs 236, 296 are applied to the input windings of the matching transformer 74. The input windings of the matching transformer 74 are set up in a balanced configuration which is required for a push-pull configuration. They serve to match the complementary output of the amplifiers to an unbalanced conventional coaxial cable system for further distribution to homes connected to the coaxial cable system.

While there has been shown and described one preferred embodiment of the invention, it will be evident to those skilled in the art that various modifications and changes may be made thereto without departing from the spirit and scope of the invention as set forth in the appended claims and their equivalents.

What is claimed is:

1. An optical receiver circuit for an optical signal having broadband radio frequency amplitude modulation, said circuit comprising:
    an optical detector having an input terminal and an output terminal, said optical detector operative for receiving said optical signal and for generating therefrom an electrical signal which varies with the power level of said optical signal;
    first amplifying means arranged in a cascode configuration for amplifying said electrical signal;
    second amplifying means arranged in a cascode configuration for amplifying said electrical signal; and
    means for coupling said first amplifying means and said second amplifying means in a push-pull relationship.

2. An optical receiver circuit in accordance with claim 1 wherein:
    said optical detector is a photodiode.

3. An optical receiver circuit in accordance with claim 2 wherein:
    said photodiode is electrically biased to conduct an electrical current only when it is activated by said optical signal.

4. An optical receiver circuit in accordance with claim 1 wherein:
    said electrical signal is a direct current with an amplitude component related to the amplitude modulation of the optical signal.

5. An optical receiver circuit in accordance with claim 2 further comprising:
    means for matching said output terminal of said photodiode to said first amplifying means and means for matching said output terminal of said photodiode to said second amplifying means.

6. An optical receiver circuit in accordance with claim 5 wherein said matching means comprises:
    a first inductive reactance connected to an input terminal of said first amplifying means and a second inductive reactance connected to an input terminal of said second amplifying means.

7. An optical receiver circuit in accordance with claim 1 wherein said first amplifying means and said second amplifying means each comprising:
    a transimpedance amplifier stage including a field effect transistor having a gate terminal, a drain terminal and a source terminal, each of said gate terminals being connected to said output terminal of said optical detector through a respective coupling capacitor, wherein the drain terminal of each field effect transistor is connected to the gate terminal of the same field effect transistor through a selectable feedback resistor.

8. An optical receiver circuit in accordance with claim 7 wherein said first amplifying means and said second amplifying means each further comprising:
    a cascode stage including a field effect transistor having a gate terminal, a drain terminal and a source terminal, each of said gate terminals being coupled to a bias source, each of said drain terminals being coupled to a power source, and each of said source terminals being coupled to the drain terminal of the field effect transistor of the transimpedance amplifier stage.

9. An optical receiver circuit for an optical signal having broadband radio frequency amplitude modulation, said circuit comprising:
    an optical detector having an input terminal and an output terminal, said optical detector operative for receiving said optical signal and for generating therefrom an electrical signal which varies with the power level of said optical signal;
    first amplifying means arranged in a cascode configuration for amplifying said electrical signal;
    second amplifying means arranged in a cascode configuration for amplifying said electrical signal;
    said first amplifying means and said second amplifying means each comprising:
        a transimpedance amplifier stage including a first field effect transistor having a gate terminal, a drain terminal and a source terminal, each of said gate terminals being connected to said output terminal of said optical detector through a respective coupling capacitor, wherein the drain terminal of each first field effect transistor is connected to the gate terminal of the same first field effect transistor through a selectable feedback resistor; and
        a cascode stage including a second field effect transistor having a gate terminal, a drain terminal and a source terminal, each of said gate terminals being coupled to a bias source, each of said drain terminals being coupled to a power source, and each of said source terminals being coupled to the drain terminal of said first field effect transistor of said transimpedance amplifier stage; and
    means for coupling said first amplifying means and said second amplifying means in a push-pull relationship.

10. An optical receiver circuit in accordance with claim 9 wherein:
    said optical detector is a photodiode.

11. An optical receiver circuit in accordance with claim 10 wherein:
    said photodiode is electrically biased to conduct an electrical current only when it is activated by said optical signal.

12. An optical receiver circuit in accordance with claim 9 wherein:
    said electrical signal is a direct current with an amplitude component related to the amplitude modulation of the optical signal.

13. An optical receiver circuit in accordance with claim 10 further comprising:
    means for matching said output terminal of said photodiode to said first amplifying means and means for matching said output terminal of said photodiode to said second amplifying means.

14. An optical receiver circuit in accordance with claim 13 wherein said matching means comprises:
    a first inductive reactance connected to an input terminal of said first amplifying means and a second inductive reactance connected to an input terminal of said second amplifying means.

* * * * *